United States Patent [19]
Taguchi et al.

[11] 4,232,213
[45] Nov. 4, 1980

[54] THERMAL HEAD

[75] Inventors: Nobuyoshi Taguchi, Higashiosaka; Koji Matsuo, Nara; Hiromu Takahashi, Hirakata; Fujio Oda, Ashiya, all of Japan

[73] Assignee: Matsushita Electric Industrial Co., Ltd., Osaka, Japan

[21] Appl. No.: 3,537

[22] Filed: Jan. 15, 1979

[51] Int. Cl.³ .............................................. H05B 1/00
[52] U.S. Cl. .................... 219/216; 219/543; 338/309
[58] Field of Search .................... 219/216, 543; 346/76 PH; 338/307–309; 427/126, 103; 29/611; 357/28; 252/518, 512

[56] References Cited
U.S. PATENT DOCUMENTS

| | | | |
|---|---|---|---|
| 3,308,528 | 3/1967 | Bullard et al. | 338/262 X |
| 3,591,413 | 7/1971 | Seki et al. | 338/308 X |
| 3,896,284 | 7/1975 | Holmes | 338/308 X |

OTHER PUBLICATIONS

Shibata, et al., IEEE Transactions on Parts Hybrids and Packaging, "New Type Thermal Printing Head Using Thin Film", vol. PHP-12, No. 3, pp. 223-230, 9/76.

*Primary Examiner*—C. L. Albritton
*Attorney, Agent, or Firm*—Stevens, Davis, Miller & Mosher

[57] ABSTRACT

A thin-film thermal head comprises a thin-film heat-generating resistor made of an alloy of Si and a high melting point metal such as Ta, Mo, Ti, W or Zr. Joule heat generated by supplying a pulse current to the thin-film heat-generating resistor is utilized to develop a color on a heat-sensitive recording paper for printing characters and pictures. Resistance against thermal shock of the thin-film heat-generating resistor is improved, thereby attaining a stable lifetime of the thermal head.

5 Claims, 7 Drawing Figures

THERMAL HEAD

The present invention relates to a thin-film heat-generating resistor for use in a thin-film thermal head for developing a color of the heat-sensitive recording paper stably by use of Joule heat.

Among several heat-sensitive recording systems, the greatest importance is attached to a thin-film thermal head including a thin-film resistor element due to the facts that detailed fine patterns, superior heat separation and saving of power consumption are possible.

As a heat-generating resistor used for such a thermal head, an alloy of Si and a high melting point metal is well known. The high melting point metal includes, for example, Ta, Mo, Ti, W or Zr.

In the case of the Ta-Si alloy, for instance, the resistivity thereof is as low as 200 to 500 $\mu\Omega$cm, and its stable region is narrow. Therefore, if the required resistance value of several hundred $\Omega$ is to be attained as a resistor, thickness of the film is required to be as thin as 100 to 500 Å. In an operation requiring a high-speed response such as 2 msec or less to an especially large applied power, the resistance against thermal shock is not secured, thus making it impossible to attain stable lifetime.

An object of the present invention is to obviate the above-mentioned disadvantage and provide a thin-film thermal head using a thin-film heat-generating resistor having a stable lifetime characteristic.

Prior to explanation of the present invention in detail, distortion due to thermal expansion of the conventional thin-film thermal heads will be analyzed. The present invention will be apparent from the following detailed description taken in conjunction with the accompanying drawings, in which.

Figure 1:
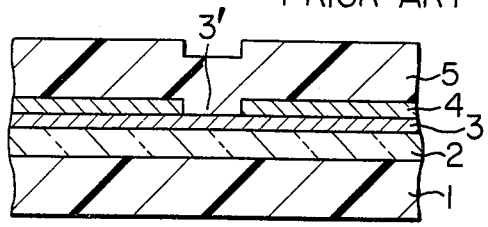
FIG. 1 is a sectional view showing an ordinary thin-film thermal head.

In FIG. 1 showing a thin-film thermal head of a conventional construction using a Ta-Si alloy as a thin-film heat-generating resistor, reference numeral 1 shows an insulating substrate made of ceramics or the like, numeral 2 a grazed layer of a glass or the like formed on the substrate 1, numeral 3 a thin-film heat-generating resistor layer formed on the grazed layer 2, numeral 4 an electrode for supplying current to the thin-film heat-generating resistor layer 3, and numeral 5 a wear-resistant layer for protecting a heat-generating section 3' formed on the thin-film heat-generating resistor layer 3 by the electrode 4.

Figure 2:
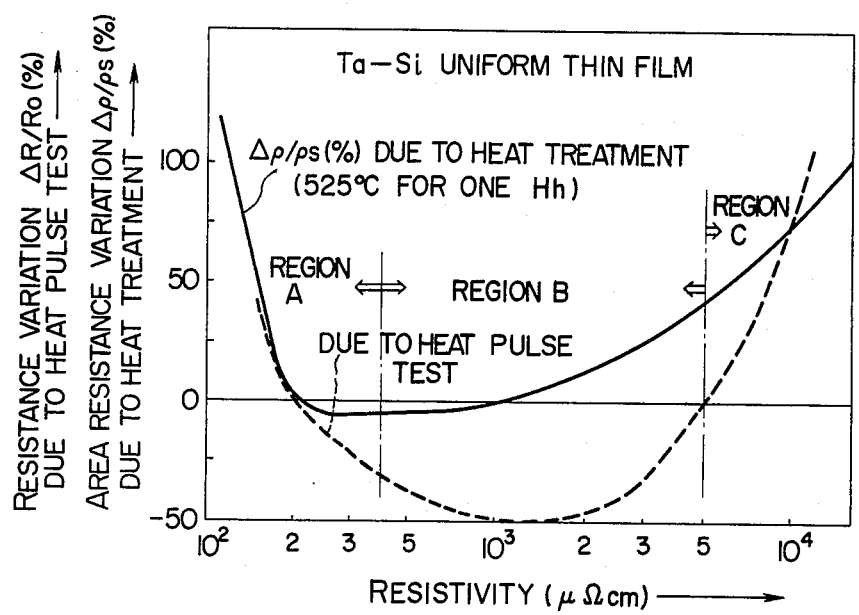
FIG. 2 is a characteristic diagram showing resistance changes by a heat treatment test or heat pulse test with respect to the resistivity of Ta-Si alloy.

The graph of FIG. 2 shows the correlation between the resistivity of the Ta-Si film uniform in the direction of the thickness of the thin-film heat-generating resistor and the area resistance variation $\Delta\rho/\rho s$ due to the heat treatment for one hour in $N_2$ gas supplied at the rate of 2 l/min at 525° C., and the correlation between such a resistivity and the resistance variation $\Delta R/Ro$ % measured in a heat pulse test where pulses of constant voltage level of 6 msec are applied in step for five minutes at the repetition frequency of 50 Hz.

First, the area resitance variation $\Delta\rho/\rho s$ due to the heat treatment is studied. In the range of resistivity from 200 to 1000 $\mu\Omega$cm, the variation is small, while it sharply increases in both directions at the resistivity of 1000 $\mu\Omega$cm or more and 200 $\mu\Omega$cm or less.

The variation at the resistivity of 200 $\mu\Omega$cm or less is caused by the oxidation of Ta, while the variation at the resistivity of 1000 $\mu\Omega$cm or more is attributable to another mechanism such as increasing in size of Si crystal or promotion of crystalization of Ta silicide.

The resistance variation $\Delta R/Ro$, due to the heat pulse test, on the other hand, is divided into the three regions of A, B and C shown in FIG. 2. In region A, TCR (temperature coefficient of resistance) is positive, and the resistance variation due to heat pulses is small. In the regions B and C, on the other hand, TCR is negative. The ratio $\Delta R/Ro$ due to the heat pulse is larger toward negative side for the region B, while $\Delta R/Ro$ is larger toward positive side for the region C.

Figure 3:
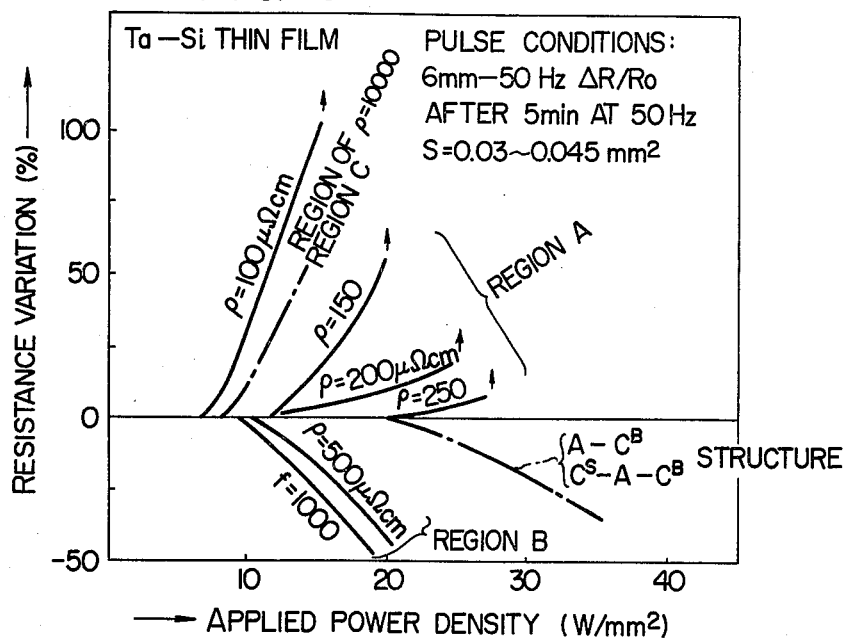
FIG. 3 is a characteristics diagram showing results of a heat pulse test conducted on Ta-Si alloy.

FIG. 3 shows an actual profile obtained by a heat pulse test. It is noted from FIG. 3 that the resistance variation $\Delta R/Ro$ is especially small in that part of region A where resistivity $\rho$ is about 200 to 250 $\mu\Omega$cm, while the ratio $\Delta R/Ro$ is increased in regions B and C.

As mentioned above, TCR is positive and the ratio $\Delta R/Ro$ is small in the region A mainly covering the resistivity of from 200 to 250 $\mu\Omega$cm. The disadvantage, however, is that in the case where the power of 25 $W/mm^2$ (with the element area of 0.03 to 0.045 $mm^2$) is applied with the pulse width of 6 msec (repetition pulses of 50 Hz), R becomes infinite after 5 minutes when the ratio $\Delta R/Ro$ is still small.

Figure 4:
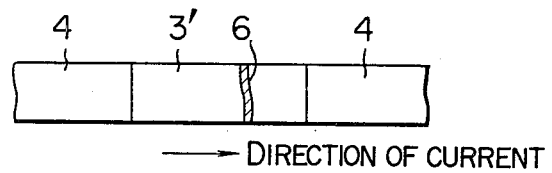
FIG. 4 is a diagram showing the broken condition of a conventional thin-film heat-generating resistor.

This is attributable to the fact that a crack 6 is developed in the thin-film heat-generating resistor layer 3 in the direction perpendicular to the current flow (along the thickness of the heat-generating resistor) as shown in FIG. 4. The crack is caused by the difference in the thermal expansion coefficient between the grazed layer 2 on the insulating substrate 1 and the thin-film heat-generating resistor layer 3.

This phenomenon is not limited to the Ta-Si alloy of region A, but often seen in a resistance material as thin as 0.1 micron or below. Al-Ti-N, NiCr or $Ta_2N$, for instance, is also broken by a crack although the ratios $\Delta R/Ro$ of these materials are different from one another. In the case of alloy Ta-Si, no crack develops in the case where $\Delta R/Ro$ is large to negative side by the increased grain size of Ta as in the region B.

According to the present invention, the breakdown of the element due to such a crack is prevented thereby increasing the resistance against applied power (resistance against heat pulses). This object may be attained by forming a high-resistivity layer of 5000 $\mu\Omega$cm or more at least under the heat-generating resistor in region A having the resistivity of mainly from 200 to 500 $\mu\Omega$cm.

Figure 5:
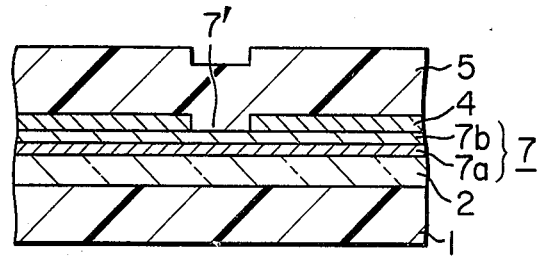
FIGS. 5 and 6 are sectional views showing thin-film thermal heads using a thin-film heat-generating resistor according to the present invention.
Figure 6:
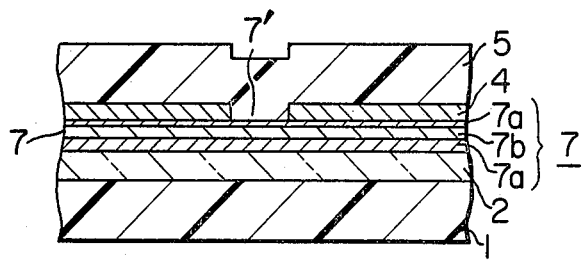

A thermal head using a heat-generating resistor layer according to an embodiment of the present invention is shown in FIG. 5, and a thermal head using a heat-generating resistor layer according to another embodiment of the present invention is shown in FIG. 6.

In FIG. 5, the thin-film heat-generating resistor layer 7 includes a high resistivity layer 7a of 5000 $\mu\Omega$cm or more in resistivity which is formed on the grazed layer 2, and a low-resistivity layer 7b of 200 to 500 μΩcm in resistivity which is formed on the high-resistivity resistor layer 7a. The assembly shown in FIG. 6 further includes a high resistivity layer 7a on the low resistivity layer 7b. Reference numeral 7' shows a heat-generating section formed by the electrode 4.

In the thin-film heat-generating resistor layer 7, the low resistivity layer 7b is mainly used as a current-carrying layer. Assume that the applied power increases and the temperature rises up to 500° to 600° C. where if the region A alone is involved, the alloy is broken down as in the manner shown in FIG. 4. In the embodiment under consideration, a reaction occurs between the newly formed high resistivity layer 7a and the low resistivity layer 7b, thus promoting the increase in grain size of Ta. As a result, no crack is developed as seen in the structure of A-$C^B$ or $C^S$-A-$C^B$ shown in FIG. 3, but the ratio ΔR/Ro is increased gradually toward negative side, so that no breakage occurs up to the power of about 40 W/mm$^2$ as compared with about 25 W/mm$^2$ in the prior art.

In FIG. 3, $C^B$ shows a high resistivity layer on the grazed layer 2, $C_S$ a high resistivity layer on the low resistivity layer, and A a low resistivity layer.

Figure 7:
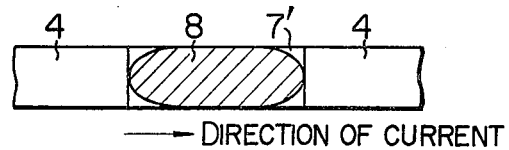
FIG. 7 is a diagram showing the almost broken condition of the thin-film heat-generating resistor according to the present invention.

The diagram of FIG. 7 shows the condition in which reaction occurred over the entire surface of the low resistivity layer 7b, thus preventing development of a crack. Numeral 8 shows a reaction region.

By this reaction, a heat-expansive buffer layer is formed between the grazed layer 2 and the thin-film heat-generating resistor layer 7, thus preventing a crack from being developed. As compared with the thickness of about 200 Å of the low resistivity layer, the high resistivity layer in the thickness of about 200 to 1000 Å is capable of fully displaying its ability. This is understood from the heat treatment conditions of 525° C. for one hour. In other words, although the area resistance variation due to heat treatment is only 0 to 4% if the resistivity of about 200 to 250 μΩcm is involved, it increases to −10 to −20% in the A-$C^B$ ($C^S$-A-$C^B$) structure, thus promoting the increase in grain size of Ta.

As noted above, according to the present invention, the high resistivity layer 7a of the thin-film heat-generating resistor layer 7 has a resistivity of 5000 μΩcm or more. This is for the reason that when the resistivity of the high resistivity layer 7a is greater than the maximum value of 500 μΩcm of the resistivity of the low resistivity layer 7b by one order or more, the current flowing in the high resistivity layer 7a is 10% or less of the current flowing in the low resistivity layer 7b, so that the superior resistance to heat pulses of the low resistivity layer 7b is not affected. In the case of a departure from the scope of the present invention, i.e., if the resistivity of the high resistivity layer 7a is less than 5000 μΩcm, the thin-film heat-generating resistor layer 7 including the high resistivity layer 7a and the low resistivity layer 7b becomes equivalent to a resistor layer including one layer having the resistivity of more than 500 μΩcm, resulting in the deterioration of the characteristics.

Further, according to the present invention, the high resistivity layer 7a may includes mere Si or SiO$_2$. However, if the high resistivity layer is comprised of an alloy of Si and a high melting point metal such as Ta, Mo, Ti, W or Zr as in the low resistivity layer 7b to change the resistivity by changing the composition, the difference in the thermal expansion coefficient between the high and low resistivity layers 7a and 7b is reduced, so that the thermal stress is reduced, thus further improving the above-mentioned effect of the present invention.

The thin-film heat-generating resistor layer 7 according to the present invention is easily produced by the method as mentioned below. At least two evaporation sources by which the amount of evaporation are adapted to be controlled separately are disposed independently of each other in one vacuum reservoir, in which two evaporation materials such as Si and Ta, Mo, Ti, W, Zr or like metal of high melting point are evaporated at different ratios of evaporation speed. The high resistivity layer 7a may of course be made of Si or SiO$_2$ or an allow of Si and a high melting point metal different from that forming the low resistivity layer 7b. In this case, too, the object of the present invention is achieved with equal effect.

The foregoing description refers to the case in which the Ta-Si alloy of the same substance of different compositions is mainly used. Instead of Ta, other high melting point metals may be used to attain the same result.

It will be understood from the foregoing description that according to the present invention a thin-film heat-generating resistor high in resistance against thermal shock and stable in useful like is obtained, thus making it possible to realize a thin-film thermal head capable of printing clear characters and pictures at high speed.

What we claim is:

1. In a thin-film thermal head comprising an insulating substrate having a glass layer on the surface thereof, a thin-film heat-generating resistor layer formed on said insulating substrate, a pair of electrodes formed on said thin-film heat-generating resistor layer to form a heat-generating section, and a wear-resistant layer formed to protect said heat-generating section;
   wherein said thin-film heat-generating resistor layer comprises a low resistivity layer made of an alloy of Si and a particular metal of high melting point and a high resistivity layer including at least Si, said low resistivity layer being formed on said glass layer of said insulating substrate through said high resistivity layer.

2. A thin-film thermal head according to claim 1, wherein said high resistivity layer is made of an alloy of Si and said particular metal of high melting point, the composition ratio of Si and said particular metal being different for each layer.

3. A thin-film thermal head according to claim 1, wherein the resistivity of said high resistivity layer is not less than 5000 μΩcm, and the resistivity of said low resistivity layer is between 200 and 500 μΩcm.

4. A thin-film thermal head according to claim 1 or 2, wherein said particular metal of high melting point is one selected from the group comprising Ta, Mo, Ti, W and Zr.

5. A thin film thermal head comprising:
   an insulating substrate having a glass layer along a surface thereof;
   a thin film heat generating resistor formed on said glass layer, said thin film heat generating resistor comprising a high resistivity layer formed on said glass layer, said high resistivity layer including at least Si, and a low resistivity layer formed on said high resistivity layer made from an alloy of Si and a particular metal having a high melting point;
   a pair of electrodes located on said thin film heat generating resistor to form a heat generating section; and
   a protective layer formed over said heat generating section to protect the same against wear.

* * * * *